(12) United States Patent
Legay et al.

(10) Patent No.: US 6,236,111 B1
(45) Date of Patent: May 22, 2001

(54) HYBRID CIRCUIT SUBSTRATE MOUNTABLE MICRO-ELECTROMECHANICAL COMPONENT

(75) Inventors: Thierry Legay, Fontenay les Briis; Dominique Gilet, Antony; Yves Campenhout, Saint George, all of (FR)

(73) Assignee: Ela Medical S.A., Montrouge (FR)

( * ) Notice: Subject to any disclaimer, the term of this patent is extended or adjusted under 35 U.S.C. 154(b) by 0 days.

(21) Appl. No.: 09/196,078

(22) Filed: Nov. 18, 1998

(30) Foreign Application Priority Data

Nov. 21, 1997 (FR) .................................................. 97 14608

(51) Int. Cl.$^7$ .................................................. H01L 23/04
(52) U.S. Cl. .................. 257/730; 257/528; 257/623; 257/777; 257/786; 257/787
(58) Field of Search .................... 361/765, 782; 438/462, 612, 25, 51, 55; 257/528, 531, 620, 627, 618, 777, 786, 619, 623, 784, 787, 730

(56) References Cited

U.S. PATENT DOCUMENTS

| | | | |
|---|---|---|---|
| 4,622,574 | 11/1986 | Garcia | 257/627 |
| 5,207,102 | 5/1993 | Takahashi et al. | 73/727 |
| 5,339,216 | 8/1994 | Lin et al. | 361/707 |
| 5,633,785 | 5/1997 | Parker et al. | 361/766 |
| 6,040,235 * | 3/2000 | Badehi | 438/464 |
| 6,086,705 * | 7/2000 | Lee et al. | 156/273.1 |

FOREIGN PATENT DOCUMENTS

WO 93/24956   12/1993 (WO) .

OTHER PUBLICATIONS

Patent Abstracts of Japan, vol. 14, No. 316, Jul. 6, 1990, Japan publication No. 02103967, dated Apr. 17, 1990.

\* cited by examiner

Primary Examiner—Olik Chaudhuri
Assistant Examiner—Alonzo Chambliss
(74) Attorney, Agent, or Firm—Orrick, Herrington & Sutcliffe, LLP

(57) ABSTRACT

A micro-electromechanical component (10) which includes a micro-system in a chip made by deposit, photolithography and micro-manufacturing of successive layers. The micro-system comprises a plurality of contact pads for electrical connection (16). The chip is provided with a localized external coating (20) to allow its transfer onto a substrate (28). This coating has on its surface a plurality of external metallizations (22) connected electrically through the coating material to the underlying contact pads of the chip. The coated component has approximately the same length and width as those of the chip before coating. The coating is formed only in a localized region on a reduced portion of the chip, essentially in the region of the pads and the metallizations, the sensing part of the micro-system not so coated and thus protected from mechanical constraints caused due to the application and hardening of the coating material.

19 Claims, 1 Drawing Sheet

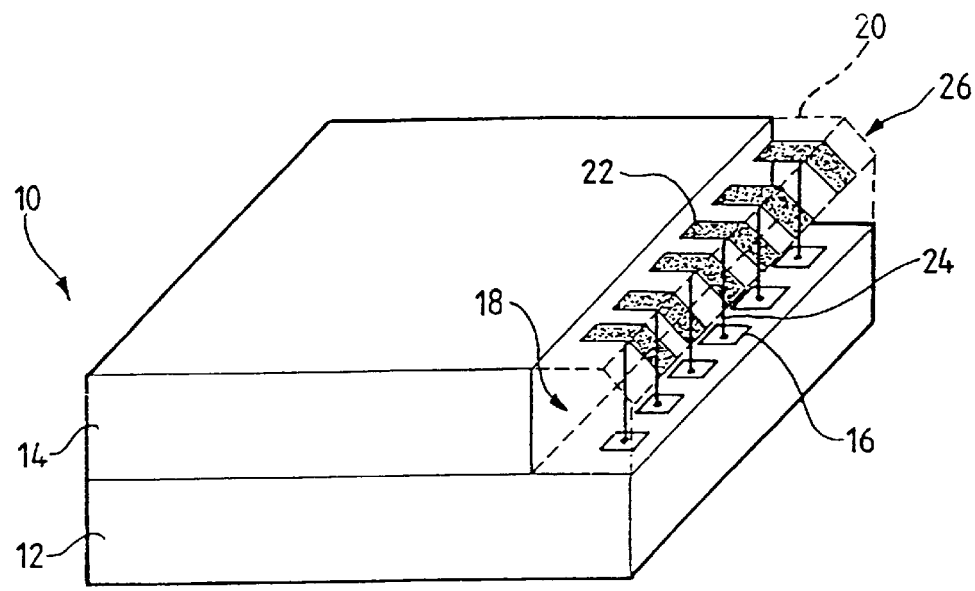
FIG_1
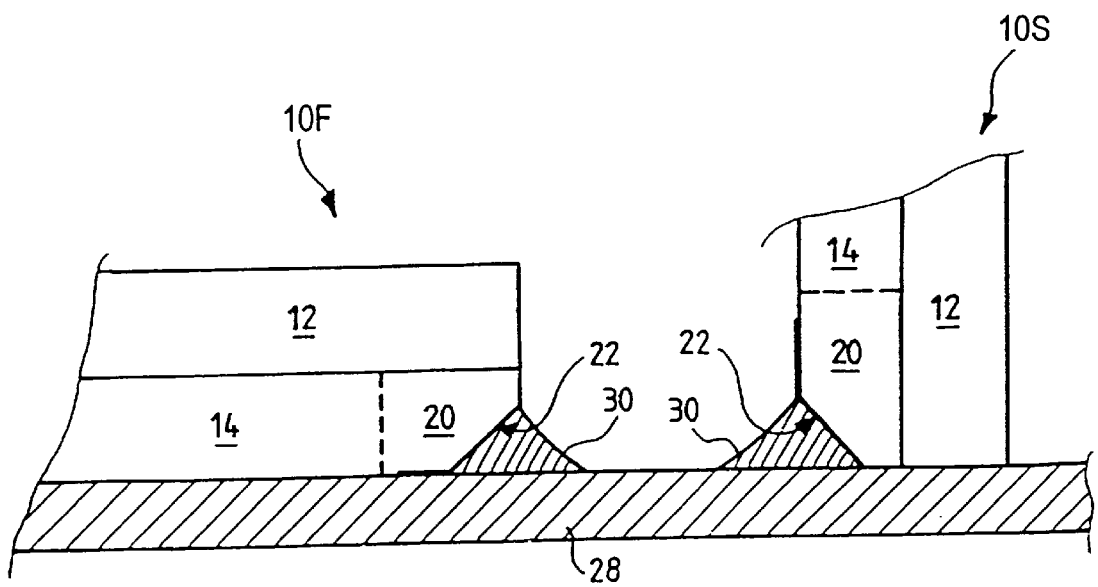
FIG_2

HYBRID CIRCUIT SUBSTRATE MOUNTABLE MICRO-ELECTROMECHANICAL COMPONENT

FIELD OF THE INVENTION

The present invention is related to micro-electromechanical components, and more particularly to a chip integrating a micro-system formed by means used in integrated circuit technology, namely deposit, photolithography and micro-manufacturing of successive layers on a substrate, generally of silicon (sometimes of another material, such as glass or quartz).

BACKGROUND OF THE INVENTION

The term "micro-system" refers to a component which transforms a physical magnitude into an electrical signal (i.e., a micro-sensor, for example, a micro-accelerometer or, on the other hand, which varies a physical magnitude, generally in the form of a displacement of a movable part, by application of an electrical signal (i.e., a micro-actuator, for example, a micro-pump, typically for a micro-syringe, or a micro-motor).

These components often comprise movable parts which move on the order of a micrometer ("micro-moving"), and are therefore, by their very nature, very sensitive to mechanical constraints imposed by their environment.

Thus, in the typical case of a micro-accelerometer, if the component is glued directly onto the substrate with a rigid glue of the epoxy resin type, for example, the simple mechanical constraints generated by this gluing could alter the sensitivity of the micro-sensor, reduce its capability to support overloads, or perhaps block its functionality completely.

For this reason, in the current state of the art, the direct transfer of such components onto a hybrid circuit substrate is a delicate task necessitating the utilization of flexible glue and of a silicon substance to protect the electrical connections.

A known direct transfer technique calls for first mounting the device on a chip-carrier which in turn is then mounted on the substrate, but then economy of space becomes a concern.

Even with advances in known techniques, to absorb any differences in dilation (i.e., expansion) coefficients between the material of the substrate (ceramics, glass epoxy, etc.) and that of the component (silicon, quartz, etc.), the presence of an intermediate resin is nevertheless indispensable. Typically, a first transfer of the component onto an intermediary silicon substrate (the silicon/silicon interface not presenting any such dilation coefficient related difficulty), is followed by a transfer from the intermediary substrate to the hybrid circuit substrate, which, for example, is ceramic, with interpositionning of the resin between these two substrates.

OBJECTS AND SUMMARY OF THE INVENTION

One of the goals of the present invention is to provide a particular component structure that overcomes the foregoing difficulties and permits the direct transfer of the component onto a hybrid circuit substrate while protecting the micro-system from any mechanical constraints which may be caused due to the application and hardening of an intermediate resin.

Another goal of the invention is to provide a component which, after transfer onto the substrate, will occupy on the substrate a surface area identical to that of one chip alone. In other words, the addition of resin to the chip for coating the component will not increase the surface area occupied by the component on the substrate.

This technology, known as "CSP" (Chip Scale Packaging), is particularly advantageous in areas where the miniaturization of circuits is an essential parameter, as, for example, in circuits of a cardiac stimulator.

To this end, the present invention provides a micro-electromechanical component with a chip comprising a micro-system formed particularly by deposit, photolithography and micromanufacturing of successive layers, in which the micro-system comprises a plurality of contact pads for electrical connection.

According to one embodiment of the present invention, the chip is provided with an external coating to allow its transfer onto a substrate. This coating has a plurality of external metallizations on its surface which are electrically connected, through the coating material, to the opposing contact pads of the chip and embedded in the thickness of the material of coating.

The coated component has roughly the same dimensions (length and width) as those of the chip before coating. The coating is formed only on a reduced portion of the chip, essentially in the region of the contact pads and the metallizations, the non-coated part being the sensitive (i.e., sensing) part of the micro-system, protected from mechanical constraints which may arise due to the application and the hardening of the coating material.

In other words, the coating covers only the electrical connections of the micro-system that are electrically and mechanically linked to the substrate. The rest of the sensor, typically made of silicon, does not necessitate coating and will be able to rest freely on the substrate without rigid connection to the substrate.

Thus, only a small portion of the component (that supporting electrical connections), which is preferably a mechanically inactive portion, will be coated with resin so as to minimize mechanical constraints which may be caused due to the hardening of this resin.

Incidentally, it should be noted that the term "coating" should not be interpreted in a restrictive sense suggesting a complete encapsulation of the chip of the component. This term as used herein refers only to the particular technology employed (i.e., "coating"), where the resin can be applied, as will be explained, only on a face of the component (that is, a layer of material deposited on the surface), and more particularly, on a localized region thereof.

In alternative embodiments, various advantageous subsidiary characteristics and features of the present invention will be appreciated.

In one embodiment, the component comprises a groove in the direction of the width of the chip, notably a lateral groove formed on an edge of the chip, which is filled by the coating material, and very advantageously the coating material levels the surface of the non-coated part to achieve a uniform surface, preferably, substantially flat and smooth.

In an alternative embodiment, the contact pads and the metallizations are situated on the same side, preferably the side of smaller dimension, of the chip. The metallizations are distributed preferably on an inclined face of a beveled chamfer of the component in a manner that the aforementioned inclined face always makes an angle with the substrate regardless of the configuration of the transfer of the component on this substrate, i.e., whether flat or on its side.

In another embodiment, the chip is formed from a plurality of superposed tablets, with an active tablet supporting the micro-system and at least one passive protection tablet sealed onto the active tablet, the length of the passive part is less than that of the active one such as to form a region where the contact pads are not covered by the passive tablet and to define in this region a lateral groove filled by the coating material.

BRIEF DESCRIPTION OF THE DRAWINGS

Further features, characteristics and advantages of the invention will be understood by those persons of ordinary skill in the art in view of the following detailed description of a preferred embodiment of the present invention, made with reference to the drawings annexed hereto in which:

FIG. 1 is a perspective view of a component realized according to the present invention; and FIG. 2 shows the component of the FIG. 1, mounted on a substrate in two possible configurations—side and flat.

DETAILED DESCRIPTION OF THE DRAWINGS

In FIG. 1, reference 10 designates a micro-electromechanical component according to the present invention, for example in one illustrative embodiment, a micro-accelerometer component (with one or two sensitive axes in the plane of the chip) used particularly as a physical activity data collector (i.e., sensor) in a rate adaptive pacemaker.

In the illustrative embodiment, the component 10 is made from two tablets (i.e., "wafers") of silicon 12, 14. (FIG. 1 represents only one individual component obtained after cutting of the whole tablets (i.e., "dicing").

Tablet 12 carries the micro-system and is designated as "active", while tablet 14 is said to be "passive" because it does not have any electromechanical or electronic elements and assumes only the role of a protective hood for the elements of the active tablet 12.

These two tablets are superposed and sealed, for example, by anodal connection (i.e., "bonding"). As tablets 12 and 14 are made of the same material, this connection does not introduce into the component any mechanical constraint attributable to the interface between the two tablets.

Active tablet 12 comprises a plurality of contact pads ("pads") 16 that are metallicy regions cropping out (as illustrated, FIG. 1) or situated each in the bottom of a socket in tablet 12.

To allow connective access to pads 16, the passive tablet 14 comprises a groove 18 in front of the pads. This groove is filled by a corresponding volume of resin coating 20 with a series of metallizations 22 (e.g., metal layered pads) on its outer surface (i.e., at the surface level of the passive tablet 14). The metallizations are identical in number to that of the pads 16, each metallization 22 corresponding to a respective pad 16. Each individual metallization 22 and the respective corresponding pad 16 are connected by a connection wire 24.

These electrical connections can be realized according to a known technique discussed in patent WO-A-93/24956, which is commonly owned by the assignee hereof, Ela Medical, and which is incorporated herein by reference, where a process of manufacture of a component is described whose face is completely covered by a layer of a coating of resin and a series of metallizations connected to the contact pads of a chip are provided, these pads being covered (or "buried") under the layer of resin. The process described in the document WO-A-93/24956, with its different variants, is suitable for implementation to realize the component of the present invention.

Referring again to FIG. 1, groove 18 can be achieved in a simple manner before the cutting of the stacked tablets into individual components by digging or cutting trenches in the outer tablet 14 to expose the pads 16, the trenches appearing externally in the form of a hatching of continuous trenches (or a grid if the component is provided with contacts on two adjacent sides).

The coating is then performed essentially in the manner taught by the aforementioned WO-A-93/24956, but flowing resin only into the trenches dug on the tablet.

The resin in this embodiment is a polymerisable material such as a polyamide, a polymer epoxy, etc. susceptible to be flowed and hardened in situ, for example, by exposure to UV radiation or thermal (i.e., heat) curing.

After polymerization, the hardened material, although essentially rigid, nevertheless exhibits sufficient flexibility to absorb differences of dilation coefficients between substrate and component, as well as the possible mechanical constraints that may appear in the interface between these two elements.

After hardening of this resin, any mechanical constraints generated on the tablet are sufficiently weak that they to do not damage the structure and final stages of the process (, e.g., grinding, grooving, depositing of the metallizations 22, etc.) can take place, accordingly to the teachings of WO-A-93/24956 above.

After the stack of tablets is cut (or"diced") into individual components, the weak constraints on the assembly dissipate, and the component (i.e., the coated micro-system) undergoes only very weak (minor) variations, if any at all, in its electromechanical characteristics.

Thus a component results comprising on one of its sides a coated region of a metallicized resin adapted to transfer onto a host substrate of a material different from that of the tablets. This transfer is undertaken as for a"CMS" ("Chip Mounting Surface") component, according to well known techniques and that will not be described here in more detail.

FIG. 2 illustrates the component 10 mounted on a substrate 28.

A beveled face 26 (shown in FIG. 1) is preferably provided to allow increase in the surface area wet by the solder 30 and also, and especially, to permit equally a flat (10F) or side (10S) mounted transfer of the component onto the substrate 28.

This last feature (side or flat mounting) is particularly advantageous, for example, in the case of a micro-accelerometer assembly, where a component, for example, a micro-accelerometer sensitive in one or two axes in the plane of the chip, is flat mounted and therefore sensitive in those axes in the plane of the substrate, while a similar component, for example, a microaccelerometer with one sensitive axis in the plane of the chip, is side mounted, sensitive in an axis perpendicular to the plane of the substrate. In this fashion, with two similar components mounted side-by-side (one flat and one on its side), one can obtain a system of 3D sensors in an orthogonal reference.

The description of the foregoing embodiments illustrates advantageous configurations of the present invention, and is not of course intended to be restrictive.

Indeed, it is desirable that the contact pads (that are, generally in the case of the microsystems, a low defined number) are gathered on the same side of the chip to facilitate coating of only the electrical connections and not of the whole micro-system.

On the other hand, in a micro-system being generally made from several superposed tablets, to limit the sensitivity of the component to constraints, it is desirable that the active mechanical part of the micro-system is situated on only one of the tablets (i.e., the active tablet 12 in the example described above), engraved in the surface and/or within the volume, and that one or two other tablets (over and/or under) provide the mechanical protection of the active tablet, with a limited electrical role, for example, for protection against noise.

In this manner, the micro-constraints operating on the passive tablets will create lesser perturbations on the overall functioning of the component.

In the case of a component made from a multi-tablet structure, it is equally desirable that all the contact pads of the micro-system are situated preferably on the active tablet so as to facilitate coating.

The present invention has been described with reference to specific embodiments thereof It will be understood by one skilled in the art that these are not exclusive embodiments, and while the foregoing description of illustrative embodiments discusses certain specificities, these enabling details should not be construed as limiting the scope of the invention, and it will be readily understood by those persons skilled in the art that the present invention is susceptible to many modifications, adaptations, and equivalent implementations without departing from this scope and without diminishing its advantages.

We claim:

1. A micro-electromechanical component comprising:
   a micro-system having a plurality of contact pads for electrical connection, the micro-system being disposed in a chip;
   a localized external coating material coating the contact pads and having an outer surface, the coating being in a localized region over a reduced portion of the chip, covering essentially the region of the contact pads; and
   a plurality of external metallizations disposed on the outer surface of the coating material, each metallization being electrically connected through the coating material to a respective underlying contact pad by a connection wire;
   wherein the coated chip has approximately the same length and width dimensions as the chip before coating.

2. The component of claim 1 wherein the chip has a width dimension in which a groove is disposed, the groove forming the localized region filled by the coating material.

3. The component of claim 2, in which the coating material fills the groove to form a uniform component surface.

4. The component of claim 2, in which the groove is a lateral groove formed along a width-wise edge of the chip.

5. The component of claim 1, wherein the chip has a plurality of sides, and wherein the pads and metallizations are situated on the same side of the chip.

6. The component of claim 5, in which the same side is that side of the chip having a smaller dimension.

7. The component of claim 5, in which the metallizations are disposed on an inclined face of a beveled chamfer of the component such that the inclined face always makes an angle with an underlying substrate to which it is transferred either flat or on its side.

8. The component of claim 1, in which the chip is formed from a plurality of superposed tablets, including an active tablet supporting the micro-system and at least one passive protection tablet seated onto the active tablet, the length of the passive part being less than that of the active part so as to form the localized region where the contact pads are not covered by the passive tablet as a lateral groove defined in this region and filled by the coating material.

9. The component of claim 8 wherein the micro-system is a micro-accelerometer.

10. A micro-electromechanical component including a micro-system disposed in a chip, the component comprising:
    a micro-system contact means for electrically connecting the micro-system;
    a localized external coating means for coating the contact means of the chip, the coating means having an outer surface and being disposed in a localized region covering a reduced portion of the chip essentially in the region of the contact means; and
    an external metallization means disposed on the outer surface of the coating means, for electrically connecting through the coating means to respective underlying contact means by a connection wire;
    wherein the coated chip has approximately the same length and width dimensions as the chip before coating. coating means.

11. The component of claim 10, further comprising a widthwise groove across the chip forming the localized region filled by the coating means.

12. The component of claim 10, in which the contact means and the metallization means are situated on the same side of the chip.

13. The component of claim 10, in which the metallization means are disposed on an inclined face of a beveled chamfer of the component such that the inclined face always makes an angle with an underlying substrate to which it is transferred, either flat or on its side.

14. The component of claim 10, in which the chip is formed from a plurality of superposed tablets, including an active tablet supporting the micro-system and at least one passive protection tablet sealed onto the active tablet, the length of the passive part being less than that of the active part so as to form the localized region where the contact means are not covered by the passive tablet as a lateral groove defined in this region and filled by the coating means.

15. A micro-electromechanical component comprising:
    a micro-system having a plurality of contact pads for electrical connection, the micro-system being disposed in a chip having a plurality of sides;
    a localized external coating material coating the contact pads and having an outer surface, the coating being in a localized region over a reduced portion of the chip, covering essentially the region of the contact pads;
    a beveled chamfer having an inclined face, the inclined face always making an angle with an underlying substrate to which it is transferred either flat or on its side; and
    a plurality of external metallizations disposed on the outer surface of the coating material and on the inclined face of the beveled chamfer, each metallization being electrically connected through the coating material to a respective underlying contact pad by a connection wire;
    wherein the contact pads and the metallizations are situated on the same side of the chip; and
    wherein the coated chip has approximately the same length and width dimensions as the chip before coating.

16. A micro-electromechanical component comprising:
    a micro-system having a plurality of contact pads for electrical connection, the micro-system being disposed in a chip;
    a localized external coating material coating the contact pads and having an outer surface, the coating being in a localized region over a reduced portion of the chip, covering essentially the region of the contact pads; and a plurality of external metallizations disposed on the outer surface of the coating material, each metallization being electrically connected through the coating material to a respective underlying contact pad by a connection wire, wherein the chip is formed from a plurality of superposed tablets, including an active tablet supporting the micro-system and at least one passive protection tablet sealed onto the active tablet, the length of the passive part being less than that of the active part so as to form the localized region where the contact pads are not covered by the passive tablet as a lateral groove defined in this region and filled by the coating material; and wherein the coated chip has approximately the same length and width dimensions as the chip before coating.

17. The component of claim 16 wherein the micro-system is a microaccelerometer.

18. A micro-electromechanical component including a micro-system disposed in a chip, the component comprising:

a micro-system contact means for electrically connecting the microsystem;

a localized external coating means for coating the contact means of the chip, the coating means having an outer surface and being disposed in a localized region covering a reduced portion of the chip essentially in the region of the contact means;

a beveled chamfer having an inclined face, the inclined face always making an angle with an underlying substrate to which it is transferred either flat or on its side; and an external metallization means disposed on the outer surface of the coating means and on the inclined face of the beveled chamfer, for electrically connecting through the coating means to respective underlying contact means by a connection wire;

wherein the coated chip has approximately the same length and width dimensions as the chip before coating.

19. A micro-electromechanical component including a micro-system disposed in a chip, the component comprising:

a micro-system contact means for electrically connecting the micro-system;

a localized external coating means for coating the contact means of the chip, the coating means having an outer surface and being disposed in a localized region covering a reduced portion of the chip essentially in the region of the contact means; and an external metallization means disposed on the outer surface of the coating means, for electrically connecting through the coating means to respective underlying contact means by a connection wire;

wherein the chip is formed from a plurality of superposed tablets, including an active tablet supporting the micro-system and at least one passive protection tablet sealed onto the active tablet, the length of the passive part being less than that of the active part so as to form the localized region where the contact means are not covered by the passive tablet as a lateral groove defined in this region and filled by the coating means; and wherein the coated chip has approximately the same length and width dimensions as the chip before coating.

* * * * *

UNITED STATES PATENT AND TRADEMARK OFFICE
CERTIFICATE OF CORRECTION

PATENT NO. : 6,236,111 B1
DATED : May 22, 2001
INVENTOR(S) : Alain Ripart

It is certified that error appears in the above-identified patent and that said Letters Patent is hereby corrected as shown below:

Column 1,
Line 18, delete "micro-accelerometer" and insert -- micro-accelerometer) -- therefor;
Line 54, delete "interpositionning" and insert -- interpositioning -- therefor;

Column 3,
Line 16, delete "the Fig. 1" and insert -- Fig 1 -- therefor;
Line 43, delete "metallicy" and insert -- metallic -- therefor;

Column 4,
Line 25, delete "accordingly" and insert -- according -- therefor;

Column 5,
Line 17, delete "thereof" and insert -- thereof. -- therefor; and

Column 6,
Line 20, delete "coating means"

Signed and Sealed this

Second Day of August, 2005

JON W. DUDAS
*Director of the United States Patent and Trademark Office*